US010859612B2

(12) United States Patent
Klapper et al.

(10) Patent No.: US 10,859,612 B2
(45) Date of Patent: Dec. 8, 2020

(54) METHOD AND TESTING DEVICE FOR TESTING WIRING OF TRANSFORMERS

(71) Applicant: Omicron electronics GmbH, Klaus (AT)

(72) Inventors: Ulrich Klapper, Rankweil (AT); Steffen Kaiser, Weissenberg (DE)

(73) Assignee: Omicron electronics GmbH, Klaus (AT)

( * ) Notice: Subject to any disclaimer, the term of this patent is extended or adjusted under 35 U.S.C. 154(b) by 276 days.

(21) Appl. No.: 15/579,486

(22) PCT Filed: Jul. 7, 2016

(86) PCT No.: PCT/EP2016/066100
§ 371 (c)(1),
(2) Date: Dec. 4, 2017

(87) PCT Pub. No.: WO2017/005846
PCT Pub. Date: Jan. 12, 2017

(65) Prior Publication Data
US 2018/0149682 A1    May 31, 2018

(30) Foreign Application Priority Data
Jul. 7, 2015 (AT) .................... 50586/2015

(51) Int. Cl.
*G01R 31/06* (2006.01)
*G01R 29/20* (2006.01)
(Continued)

(52) U.S. Cl.
CPC ......... *G01R 21/06* (2013.01); *G01R 19/2513* (2013.01); *G01R 31/3277* (2013.01);
(Continued)

(58) Field of Classification Search
CPC  G01R 31/041; G01R 31/088; G01R 31/3277; G01R 35/02; G01R 19/14; G01R 19/2513; G01R 21/06; H02H 3/044
See application file for complete search history.

(56) References Cited

U.S. PATENT DOCUMENTS 1,972,243 A    9/1934  Nolke
3,932,311 A    1/1976  Branch
(Continued)

FOREIGN PATENT DOCUMENTS

CN    101504448    8/2009
CN    101512861    8/2009
(Continued)

OTHER PUBLICATIONS

Translation of Search Report, counterpart Russian Appl. No. 2017144532 (dated Aug. 16, 2018) (2 pages).
(Continued)

*Primary Examiner* — Minh N Tang
(74) *Attorney, Agent, or Firm* — Cook Alex Ltd.

(57) ABSTRACT

A testing device for an apparatus of an energy system which has inputs that can be connected in a conductive manner to at least one current transformer and at least one voltage transformer. The testing device is designed to apply a first test signal to a secondary side of the voltage transformer and, at the same time, to apply a second test signal to a primary side of the current transformer.

23 Claims, 7 Drawing Sheets

(51) Int. Cl.
*G01R 21/06* (2006.01)
*G01R 19/25* (2006.01)
*H02H 3/04* (2006.01)
*G01R 31/327* (2006.01)
*G01R 35/02* (2006.01)
*G01R 31/67* (2020.01)
*G01R 19/14* (2006.01)

(52) U.S. Cl.
CPC .............. *G01R 31/67* (2020.01); *G01R 35/02* (2013.01); *H02H 3/044* (2013.01); *G01R 19/14* (2013.01)

(56) References Cited

U.S. PATENT DOCUMENTS

| | | | | |
|---|---|---|---|---|
| 4,555,681 | A * | 11/1985 | Dominick | H03H 7/52 333/112 |
| 5,396,172 | A | 3/1995 | Lat et al. | |
| 5,773,980 | A * | 6/1998 | Yang | G01R 31/088 324/522 |
| 6,608,493 | B2 | 8/2003 | Hensler et al. | |
| 7,119,548 | B1 | 10/2006 | Cook et al. | |
| 2002/0057091 | A1 | 5/2002 | Hensler et al. | |
| 2006/0085144 | A1* | 4/2006 | Slota | G01R 35/04 702/57 |
| 2011/0148431 | A1* | 6/2011 | Satou | G01R 31/027 324/547 |
| 2014/0118015 | A1* | 5/2014 | Milner, Jr. | G01R 29/20 324/726 |
| 2014/0125351 | A1 | 5/2014 | Woodward, Jr. et al. | |
| 2016/0025797 | A1* | 1/2016 | Kruger | G01R 31/027 324/726 |

FOREIGN PATENT DOCUMENTS

| | | |
|---|---|---|
| CN | 101930063 | 12/2010 |
| CN | 201819972 | 5/2011 |
| CN | 102156274 | 8/2011 |
| CN | 202975235 | 6/2013 |
| CN | 103954883 | 7/2014 |
| DE | 10048962 | 4/2002 |
| DE | 10261848 | 7/2004 |
| GB | 2504899 | 2/2014 |
| JP | 2007-285790 | 11/2007 |
| JP | 2009-236662 | 10/2009 |
| RU | 80705 | 2/2009 |
| SU | 1610518 | 11/1990 |
| SU | 1725175 | 4/1992 |
| WO | WO0235248 | 5/2002 |

OTHER PUBLICATIONS

Translation of Korean Intellectual Property Office Notice of Preliminary Rejection, counterpart Korean App. No. 10-2017-7036295 (dated May 20, 2019) (15 pages).

International Search Report, counterpart International Appl. No. PCT/EP2016/066100, pp. 6 (dated Oct. 14, 2016) (with translation 2 pages).

International Written Opinion Report, counterpart International Appl. No. PCT/EP2016/066100, pp. 6 (dated Oct. 14, 2016) (without translation).

Austrian Search Report, counterpart Austrian Appl. No. A 50586/ 2015, pp. 3 (dated Jun. 22, 2016) (without translation).

Translation of China National Intellectual Property Administration Search Report, counterpart App. No. 2016800359331, dated Jul. 3, 2019 (2 pages).

* cited by examiner

METHOD AND TESTING DEVICE FOR TESTING WIRING OF TRANSFORMERS

The present application is a U.S. National Stage of PCT international Patent Application No. PCT/EP2016/066100, filed Jul. 7, 2016, which claims priority to Austrian Application No. A 50586/2015, filed Jul. 7, 2015, both of which are hereby incorporated herein by reference.

FIELD OF THE INVENTION

Exemplary embodiments of the invention relate to apparatuses and methods for testing devices of electrical energy systems, such as apparatuses and methods for testing a protective device, e.g. a protective relay, for example. Exemplary embodiments of the invention relate particularly to such apparatuses and methods as can be used to check whether one or more current transformers and one or more voltage transformers of a protective device or of another secondary device are correctly installed and connected and/or whether there are polarity errors.

BACKGROUND

Protective devices are important components of electrical energy systems. Such protective devices may be set up to allow rapid isolation in the event of a fault. Particularly in the medium-voltage, high-voltage and maximum-voltage spheres, these protective devices can comprise current and voltage transformers that transform the currents and voltages of the primary system to low voltages that are easier to handle.

An example of such protective devices is a protective relay, which performs the evaluation of whether there is a fault and what the nature of this fault is, in order to make a decision regarding whether, how quickly and/or in which phases it is necessary for switch-off to take place. The actual isolation can be carried out by circuit breakers, for example self-blowing switches, other encapsulated circuit breakers or unencapsulated circuit breakers that are controlled by the protective relay or another protective device.

An important decision in regard to the installation and manner of operation of such a protective device is what is known as the forward/backward decision. This stipulates in which of two directions the protective device isolates more rapidly. By way of example, isolation can take place more rapidly in the event of a fault in a first line section, e.g. an overhead line, than in the event of a fault in a second line section situated on the opposite side of the protective device and ending directly at a transformer substation.

A fault that is "upstream" of the protective device can be isolated more quickly than a fault that is "downstream" of the protective device, since isolating a fault that is downstream of the area under consideration would have no meaningful effect. The forward/backward decision is used to stipulate the direction in which the protective device looks to a certain extent, i.e. the direction of the line section for which more rapid isolation in the event of a fault takes place on fault detection.

By way of example, a line protection relay can look forward onto an overhead line. The line protection relay could have a transformer substation downstream of it. If the fault were to be close by upstream of the line protection relay, that is to say on the overhead line, the line protection relay would have to isolate as quickly as possible. If the fault were to be downstream of the line protection relay, that is to say in the transformer substation, e.g. in a transformer or on a busbar, however, isolation would have only little effect, since the transformer substation is served by many signal sources. To protect the parts of the plant, it is possible to use other protective relays, for example a transformer differential or a busbar protection system.

The direction decision that indicates the direction in which the protective device isolates quickly is particularly important to the manner of operation. If, by way of example, the line protection relay already described above is installed such that it switches off for the wrong direction, the protective device would not isolate in the event of a fault on the overhead line. An incorrect direction decision, which can be caused by incorrect installation or incorrect wiring, can have fatal consequences for the whole electrical system.

A direction decision by the protective device can be made correctly only if the current transformers and the voltage transformers to the protective relay are correctly wired up and set.

There are numerous sources of error that can lead to a wrong direction decision. By way of example, in the case of a current transformer, an incorrect direction of installation of the current transformer, a polarity error in the current transformer, wrong connection of the current transformer on a secondary side, transposition of the two lines between the current transformer and a protective relay, wrong connection of the lines to the protective relay or a wrongly selected direction of installation of the current transformer in the protective relay can lead to a protective device unintentionally looking in the wrong direction, i.e. not isolating quickly enough in the event of faults in a line section.

Alternatively or additionally, a wrong direction decision can also be caused by wrong installation of a voltage transformer. This can happen if the secondary wiring of the voltage transformer on the path from the voltage transformer to the relay is transposed, for example.

Direction decisions are relevant not only to protective devices but also to other devices of electrical energy systems. By way of example, the direction of a flow of energy is relevant to displays in a control room. Not only is the absolute value of the energy important, but also the direction of the flow of energy is significant to the manner of operation. Similarly, direction decisions also exist for meters, to which the direction of the flow of energy is relevant.

Wrong installation, wrong wiring or a wrongly selected direction of installation of transformers in the secondary device that processes the output signals of the transformers further can lead to polarity errors.

Protective devices such as protective relays, meters, displays in the control room and similar devices fed by current and voltage transformers are also referred to generally as secondary devices here, which receive parameters of the primary system that are transformed by means of the transformers.

To test parts of the wiring of such secondary devices, it is possible for a current to be supplied on a primary side of a current transformer and for the polarity of the wiring to be read off on the secondary side of the current transformer using a microampere meter or another measuring device, for example. Such techniques make high demands on the testing personnel, can lead to undesirable magnetization of a transformer core of the current transformer and cannot identify numerous sources of error, for example wrong connection of the current transformer to a protective relay.

Alternatively, an AC signal can be impressed into the current transformer. A polarity detector attuned to the AC signal can be used to check the polarity on the secondary side of the current transformer along the wiring and also at the protective relay itself. These methods also make relatively high demands on the testing personnel and cannot detect incorrect instances of wiring of the voltage transformer, for example.

Furthermore, the cited methods are time consuming.

SUMMARY OF THE INVENTION

In view of the cited disadvantages of conventional methods, there is a need for apparatuses and methods that allow the dependability of energy engineering devices to be increased further. There is particularly a need for apparatuses and methods that allow incorrect installation, transposition of secondary-side wires and/or incorrect connection of current or voltage transformers to be detected in a simple manner.

In view of the cited disadvantages of conventional methods, it would be particularly desirable to check the wiring between current and voltage transformers and a protective relay or another device of the secondary system for all possible polarity errors and to rule out all possible sources of error with a single test, which may comprise one or more steps.

According to exemplary embodiments, methods, apparatuses and systems are specified that can be used to detect polarity errors that can exist when current and voltage transformers are used for protective devices such as protective relays, for energy meters, for displays in a control room or for other devices of energy systems.

According to exemplary embodiments, a first test signal is applied to a secondary side of a voltage transformer that is connected to a protective device or another device of the secondary system and at the same time a second test signal is impressed into a primary side of a current transformer that is connected to the protective device or the other device of the secondary system. A response by the device to the first test signal and the second test signal can be monitored and compared with a simulated, for example a computationally predicted, response.

According to exemplary embodiments, the response of the device may be a power that is recorded by the protective device or another device of the secondary system. An arithmetic sign and optionally also an absolute value of the recorded power can be compared with the computationally ascertained power that is expected for the phase angles of the first and second test signals and optionally the amplitudes thereof.

The power that is recorded and/or computationally ascertained as a response may be or comprise an active power. Alternatively or additionally, the power that is recorded and/or computationally ascertained as a response may be or comprise a reactive power.

Alternatively or additionally, the response evaluated may be a current amplitude, a voltage amplitude and a phase angle between current and voltage that are recorded and optionally displayed by the device.

A method for testing wiring of at least one current transformer and at least one voltage transformer of a device of an electrical energy system is provided according to one exemplary embodiment. The method comprises applying a first test signal to a secondary side of a voltage transformer of the device and impressing a second test signal into a primary side of a current transformer of the device, wherein the first test signal and the second test signal are generated at the same time.

The method obtains a response from the device, for example in the case of a protective relay or a display in the control room. Since there are distinctly more sources of error for polarity errors in the case of a current transformer than in the case of a voltage transformer, the supply of current to the current transformer is, according to exemplary embodiments, performed on the primary side. This allows the direction of installation and the polarity of the current transformer and also the secondary connection terminals to be checked together in the same step.

The first test signal and the second test signal can advantageously be provided to a current transformer and to the secondary wiring of a voltage transformer that are connected to the same phase at the same time. The generation of test signals and the subsequent evaluation of a response to the test signals can be repeated for the current transformers and voltage transformers of the other phases so as also to be able to rule out wiring errors on the other phases.

The method can comprise evaluating a response of the device to the first test signal and the second test signal.

To evaluate the response of the device, an expected response can be simulated from an amplitude of the first test signal, an amplitude of the second test signal and a phase relationship between the first test signal and the second test signal. The expected response may additionally depend on a transformation ratio of the current transformer.

The expected response can be automatically ascertained by a testing apparatus and compared with the response of the device, which can be recorded by the testing apparatus or a user.

The response of the device can comprise a power recorded by the device. In this case, it is at any rate possible for an arithmetic sign of the recorded power and optionally also the absolute value of the recorded power to be evaluated to determine whether they match the arithmetic sign and/or the corresponding absolute value of the power that are expected for the first test signal and the second test signal.

The first test signal may be an AC voltage. The first test signal can be generated by a first signal source that may be integrated in a tester. The first signal source may be a controllable voltage source.

The second test signal may be an alternating current. The second test signal can be generated by a second signal source that may be integrated in the tester. The second signal source may be a controllable current source.

The first test signal and the second test signal may be in phase. In this case, wiring that has no polarity errors should result in a power display in the forward direction at the protective relay, in the meter or in the control room. From a power display with the inverse arithmetic sign, it is possible to infer the presence of a polarity error in the wiring, wrong installation of the current transformer or a wrongly selected direction of installation of the current transformer at the protective relay or in the control room.

The first test signal can be applied to the secondary side of the voltage transformer that is associated with a first phase of multiple phases. The second test signal can be impressed into the primary side of the current transformer that is associated with the first phase.

The test on the wiring of the transformers of different phases can take place with sequential timing or in overlapping fashion. For a check with sequential timing, the generation of the first test signal and the second test signal can be repeated, the first test signal being impressed on the secondary side of a voltage transformer and the second test signal being impressed on the primary side of the current transformer of the same phase in each case.

The method can comprise generating at least one further test signal for at least one further transformer that is associated with a further phase, which is different than the first phase, of a polyphase line.

The at least one further test signal can be generated at the same time as the first test signal and the second test signal. As a result, the test on the wiring of the transformers of different phases can be carried out at overlapping times at least to some extent.

The first test signal and at least one further AC voltage signal can be applied to the secondary side of at least two voltage transformers of the device that are associated with different phases at the same time. As a result, the test on the wiring of the transformers of different phases can be carried out at overlapping times at least to some extent.

The first test signal and the at least one further AC voltage signal can have different amplitudes. As a result, the test on the wiring of transformers of different phases at the same time is facilitated, since an association with the different phases is possible on the basis of the amplitudes of the recorded power.

The second test signal and at least one further AC current signal can be applied to the primary side of at least two current transformers of the device that are associated with different phases at the same time. As a result, the test on the wiring of the transformers of different phases can be carried out at overlapping times at least to some extent.

The second test signal and the at least one further AC current signal can have different amplitudes. As a result, the test on the wiring of transformers of different phases at the same time is facilitated, since an association with the different phases is possible on the basis of the amplitudes of the recorded power.

Test signals can be impressed into the primary side of three current transformers and test signals can be impressed into the secondary side of three voltage transformers of the device at the same time. The test signals, which are associated with different phases, can each have different amplitudes in this case, in order to be able to identify a transposition of connections at the protective relay, for example. The test signals associated with different phases can each have a phase shift of 120° relative to one another.

The at least one voltage transformer can be disconnected on the secondary side for the test while the first test signal is applied to the secondary side. This prevents step-up transformation of the voltage, which would firstly result in an increased power requirement and would secondly be a safety risk in the energy plant.

The method can be used to check the wiring of multiple current and voltage transformers that are connected to a protective relay.

The method can be used to check whether multiple current and voltage transformers have been installed and wired up such that a protective relay isolates more quickly in the event of a fault that occurs on a prescribed first side relative to the protective relay than in the event of a fault that occurs on a second side, which is opposite from the first side, relative to the protective relay.

The method can be used to check whether multiple current transformers and their connections to a secondary device, for example a protective relay, have the correct polarity.

The multiple current and voltage transformers can connect a primary system, which may be a medium-voltage or high-voltage system, to the device, which may be part of the secondary system, in which there are lower voltages. The multiple current and voltage transformers may be set up to provide the device of the secondary system, during operation, with voltages that are smaller than the voltages of the primary system that have the input sides of the current transformers and the voltage transformers connected to them.

A testing apparatus for testing wiring of at least one current transformer and at least one voltage transformer of a device of an electrical energy system is specified according to a further exemplary embodiment. The testing apparatus comprises a first output for applying a first test signal to a secondary side of a voltage transformer of the device and a second output for impressing a second test signal into a primary side of a current transformer of the device, wherein the testing apparatus is set up to generate the first test signal applied to the secondary side of the voltage transformer and the second test signal impressed into the primary side of the current transformer at the same time.

The testing apparatus can comprise an electronic computation device that is set up to computationally ascertain an expected response of the device to the first test signal and the second test signal from an amplitude of the first test signal, an amplitude of the second test signal and a phase relationship between the first test signal and the second test signal.

The electronic computation device may be set up to ascertain at least one arithmetic sign of a power recorded by the device as a response to the first test signal and the second test signal.

The electronic computation device may be set up to ascertain an absolute value of a power recorded by the device as a response to the first test signal and the second test signal.

The testing apparatus can comprise an output interface for outputting the computationally ascertained expected response. By way of example, it is possible to output which arithmetic sign a power ascertained by the device, which power is displayed in a control room, for example, will have if there are no wiring errors or other polarity errors. Depending on a comparison of the arithmetic sign of the power that is ascertained by the device with the power arithmetic sign expected for the test signals, it is possible to determine whether there is a wiring error or polarity error.

The testing apparatus can comprise an input interface for receiving the response of the device. By way of example, the testing apparatus may be set up to use the input interface to receive an arithmetic sign and optionally also an absolute value of a power ascertained by the device as a response to the first and the second test signal. The testing apparatus may be set up to evaluate the response of the device, received via the input interface, to the first test signal and the second test signal. To this end, the testing apparatus may be set up to ascertain whether the received response has an arithmetic sign and optionally an absolute value that is consistent with the response expected for the first and second test signals. The input interface may be or comprise a user interface that the user can use to input information about the response of the device.

If the testing apparatus is set up to test the wiring of current and voltage transformers of multiple phases, the output interface can be used to output more than one expected response. By way of example, the arithmetic signs and optionally also the absolute values can be output by multiple power displays of a control room that are expected as a response to the test signals for multiple phases.

If the testing apparatus is set up to test the wiring of current and voltage transformers of multiple phases, the input interface can be used to receive more than one response. By way of example, the arithmetic signs and optionally also the absolute values can be received by multiple power displays of a control room that are expected as a response to the test signals for multiple phases, and can be evaluated further by the testing apparatus.

The testing apparatus can comprise one or more controllable signal sources in order to generate the first test signal and the second test signal.

The signal sources may be controllable such that they are selectively operable as a current source and as a voltage source.

The testing apparatus can comprise a controllable voltage source for generating the first test signal.

The testing apparatus can comprise a controllable current source for generating the second test signal.

The testing apparatus may be set up to apply the first test signal and at least one further AC voltage signal to the secondary side of at least two voltage transformers of the device that are associated with different phases at the same time.

The testing apparatus may be set up to generate the first test signal and the at least one further AC voltage signal such that they have different amplitudes.

The testing apparatus may be set up to impress the second test signal and at least one further AC current signal into the primary side of at least two current transformers of the device that are associated with different phases at the same time.

The testing apparatus may be set up to generate the second test signal and the at least one further AC current signal such that they have different amplitudes.

The testing apparatus may be configured as a tester.

The tester may be a mobile, in particular a portable, tester.

The testing apparatus may be set up to perform the method according to any of the described exemplary embodiments.

A system according to one exemplary embodiment comprises a device that has at least one current transformer and at least one voltage transformer, and a testing apparatus according to an exemplary embodiment that is connected to the secondary side of a voltage transformer and to the primary side of a current transformer.

The device may be a device for a secondary system, which device is coupled to the primary system via the at least one current transformer and the at least one voltage transformer.

The device can comprise a protective relay, a power display of a control room, an energy meter or another device.

If the device comprises a protective relay, the testing apparatus may be able to be used to ascertain whether all the current transformers and all the voltage transformers are installed and wired up such that the protective relay isolates more quickly in the event of a fault that occurs in a prescribed direction relative to the protective relay than in the event of a fault that occurs in the opposite direction relative to the protective relay.

If the device comprises a power display of a control room, the testing apparatus may be able to be used to ascertain whether all the current transformers and all the voltage transformers are installed and wired up such that the power for each phase is ascertained with the correct arithmetic sign in each case.

If the device comprises an energy meter, the testing apparatus may be able to be used to ascertain whether all the current transformers and all the voltage transformers are installed and wired up such that the direction of the flow of energy is ascertained correctly by the energy meter.

In the case of apparatuses, systems and methods according to exemplary embodiments, at least the second test signal supplied to the primary side of the current transformer can be generated with an amplitude and/or frequency that is variable on the basis of time. In this way, the risk of magnetization of the transformer core of the current transformer can be reduced and/or the transformer core can be demagnetized. If the frequency of the second test signal is altered on the basis of time, the frequency of the first test signal can also be altered accordingly in order to make certain that the first test signal applied to the secondary side of the voltage transformer and the second test signal impressed on the primary side of the current transformer of the same phase are in phase.

Apparatuses, methods and systems according to exemplary embodiments allow the wiring and other possible polarity error sources that can exist between current and voltage transformers and a device of a secondary system to be efficiently checked. The risk of polarity errors existing that can impair the operability of the electrical energy system can be reduced.

BRIEF DESCRIPTION OF THE FIGURES

The invention is explained in more detail below using preferred embodiments with reference to the drawings.

In the drawings, identical reference symbols denote identical elements.

DETAILED DESCRIPTION OF EXEMPLARY EMBODIMENTS

Figure 1:
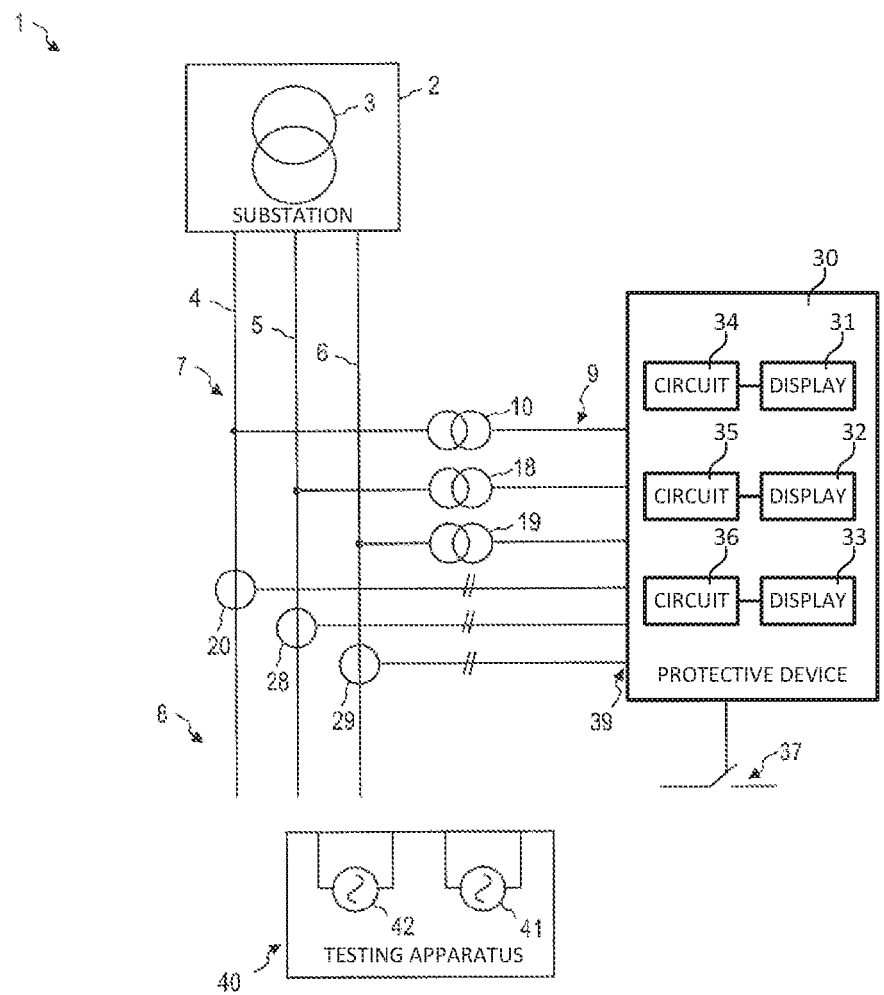
FIG. 1 shows a system with an apparatus according to an exemplary embodiment.

The present invention is explained in more detail below using preferred embodiments with reference to the drawings. In the figures, like reference symbols denote like or similar elements. The figures are schematic depictions of various embodiments of the invention. Elements depicted in the figures are not necessarily depicted to scale. Rather, the various elements depicted in the figures are reproduced such that their function and purpose become comprehensible to a person skilled in the art.

Connections and couplings depicted in the figures between functional units and elements can also be implemented as indirect connection or coupling. A connection or coupling may be implemented in wired or wireless form.

While exemplary embodiments are described within the context of current transformers and voltage transformers whose output is connected to a protective device, for example a protective relay, the methods and apparatuses can also be used for other devices, particularly from secondary engineering for electrical energy systems, in which the correct polarity of the installation and the connection between current transformers and the device and also the correct polarity of the connection between voltage transformers and the device are significant for correct operation. Examples of such devices are meters, other measuring devices and power displays, for example a power display of a control room.

Apparatuses and methods are described below that can be used to check that the connection between current transformers and a protective device or another device of the secondary system and the connection between voltage transformers and the protective device or the other device of the secondary system is correct and has no wiring errors, i.e. no transposition of the connecting lines. Other polarity errors, for example installation of one or more current transformers with the wrong polarity or a wrongly selected polarity of the current transformer in the control room or in the protective relay, can likewise be identified.

For testing, a first test signal is provided on a secondary side of a voltage transformer and a second test signal is provided in a primary side of a current transformer at the same time. The first test signal can be applied to the secondary wiring between the voltage transformer and the secondary device without needing to be applied to both output connections of the voltage transformer. Applying the first test signal "to the secondary side of the voltage transformer" is understood to mean a process in which the first test signal is applied to the wiring between the voltage transformer and the device.

A response of the protective device, for example an arithmetic sign and optionally an absolute value of a power, which may be an active power or a reactive power, ascertained by the protective device as a reaction to the first test signal and the second test signal, can be evaluated in order to check whether both the current transformer and the voltage transformer are installed and wired up such that there are no polarity errors. The response of the protective device can be compared with a computationally ascertained response, for example with an arithmetic sign, computationally ascertained by a testing apparatus, for the power that should be recorded by the protective device, in order to ascertain whether there are wiring errors, where the lines have been transposed, or other polarity errors. Alternatively or additionally, the response evaluated may be a current amplitude, a voltage amplitude and a phase angle between current and voltage that are recorded and optionally displayed by the device.

The test can be performed sequentially or at the same time for current and voltage transformers that are associated with different phases, e.g. three phases of a three-phase line, as described in even more detail.

The current and voltage transformers each have a primary side and a secondary side. In this case, the primary side is respectively defined as that side that is connected to the primary system, for example the medium-voltage, high-voltage or maximum-voltage system. The secondary side is respectively defined as that side that is connected to a device of the secondary system, for example a protective device, a control room or a meter. The secondary side of each transformer may be DC-isolated from the primary side in each case.

FIG. 1 shows a system 1 according to an exemplary embodiment. The system 1 comprises a protective device 30 in a secondary system of the electrical energy system. The protective device 30 can have inputs 39 that are conductively connected to a voltage transformer or multiple voltage transformers 10, 18, 19 and to a current transformer or multiple current transformers 20, 28, 29 by means of wiring 9. Even if only one line is schematically depicted in each case, it goes without saying that the outputs of the transformers may be connected to the inputs 39 of the protective device 30 by two lines in each case.

The protective device 30 can comprise a protective relay. The protective device 30 may be set up to process the output signals of the at least one voltage transformer 10, 18, 19 and the at least one current transformer 20, 28, 29 further in order to detect faults, to monitor a flow of energy or for other purposes.

By way of example, the protective device 30 can comprise one or more circuits 34, 35, 36, that are set up to ascertain a power flowing in the primary system from the output signals of the at least one voltage transformer 10, 18, 19 and the at least one current transformer 20, 28, 29. The protective device 30 can comprise one or more circuits 34, 35, 36 that are set up to ascertain from the output signals of the at least one voltage transformer 10, 18, 19 and the at least one current transformer 20, 28, 29 whether a circuit breaker 37 is intended to be actuated such that isolation is effected. The circuit breaker 37 can be actuated by a protective relay in different ways, depending on whether a fault is detected on a first side 8 or on a second side 7, opposite therefrom, relative to the point at which the protective device 30 is coupled to the primary system via the transformers. The testing apparatus 40 according to exemplary embodiments can be used to check whether the wiring 9 and the polarity of the current transformers 20, 28, 29 is chosen such that faster isolation is effected in the event of a fault that is present on a predefined first side 8 relative to the protective device 30. By way of example, the first side 8 may be the side on which an overhead line is on hand, while the second side 7 is the side on which, at a short distance, a transformer substation 2 is situated whose transformer(s) 3 are fed by one or more power stations. The polarity decision of the protective device 30, which stipulates in which of the two directions more rapid isolation is effected in the event of a fault, can be checked using the testing apparatus 40.

The protective device 30 can comprise one or more displays 31, 32, 33 that display a power in the primary system. The power can be displayed with positive or negative arithmetic sign depending on the direction in which a flow of energy takes place in the primary system. The direction decision of the power measurement, which indicates the direction in which the flow of power in the primary system is recorded as positive power, is dependent on the correct wiring 9 and the correct installation of the current transformers 20, 28, 29. This direction decision for the power recording, which stipulates in which of the two directions a flow of energy in the primary system is recorded as positive power, can be checked using the testing apparatus 40. This likewise applies when the power recording is effected independently of a protective device 30, for example on a display in a control room.

Instead of or in addition to the protective device 30, it is also possible for a meter to be coupled to outputs of the transformers. A recorded flow of energy can be metered with a positive or negative arithmetic sign depending on the direction in which the flow of energy takes place in the primary system. The direction decision for the meter, which indicates the direction in which the flow of energy in the primary system leads to an incrementation of the recorded energy, is dependent on the correct wiring 9 and the correct installation of the current transformers 20, 28, 29. This direction decision for the meter, which stipulates in which of the two directions a flow of energy in the primary system leads to an increase in the metered energy, can be checked using the testing apparatus 40.

The testing apparatus 40 is set up to provide AC signals to the secondary side of a voltage transformer and the primary side of the current transformer that is associated with the same phase as the voltage transformer at the same time.

The testing apparatus 40 has a first output for connection to the secondary side of a voltage transformer 10 that is associated with a phase 4. The testing apparatus can have a first signal source 41 in order to apply a first test signal via the first output to the secondary side of the voltage transformer 10 that is associated with the phase 4. The first signal source 41 may be an AC voltage source. The first signal source 41 may be controllable such that it can be operated either as a voltage source or as a current source. The first test signal may be an AC voltage signal.

The testing apparatus 40 has a second output for connection to the secondary side of a current transformer 20 that is associated with the phase 4. The testing apparatus can have a second signal source 42 in order to supply a second test signal via the second output to the primary side of the current transformer 20 that is associated with the phase 4. The second signal source 42 may be an AC current source. The second signal source 42 may be controllable such that it can be operated either as a voltage source or as a current source.

The first signal source 41 and the second signal source 42 may be in the form of separate units. Alternatively, an output signal of the same signal source can be supplied via different circuits both to the secondary side of the voltage transformer 10 and to the primary side of the current transformer 20 of the same phase 4. The first signal source 41 and the second signal source 42 may be arranged in a housing of a tester or can be arranged in separate housings.

The testing apparatus 40 may be set up to carry out a test, in which a first test signal is applied to the secondary side of a voltage transformer and a second test signal is applied to the primary side of the current transformer of the same phase, at sequential times for the multiple phases 4, 5, 6. The testing apparatus 40 can comprise connections that are set up to connect the testing apparatus 40 to the primary sides of multiple current transformers 20, 28, 29 that are associated with different phases 4, 5, 6 and to the secondary sides of multiple voltage transformers 10, 18, 19 that are associated with different phases 4, 5, 6 at the same time.

The testing apparatus 40 can comprise an electrically controllable arrangement of switches that is set up to connect the first signal source 41 to the secondary side of different voltage transformers 10, 18, 19 without this requiring rewiring to be performed between the testing apparatus 40 and the voltage transformers 10, 18, 19. The testing apparatus 40 can comprise an electrically controllable arrangement of switches that is set up to connect the second signal source 42 to the primary side of different current transformers 20, 28, 29 without this requiring rewiring to be performed between the testing apparatus 40 and the current transformers 20, 28, 29.

Alternatively or additionally, the testing apparatus 40 may be set up to apply AC voltage signals of the same or different amplitude to the secondary sides of at least two voltage transformers 10, 18, 19 at the same time and to apply AC current signals of the same or different amplitude to the primary sides of at least two current transformers 20, 28, 29 at the same time.

By way of example, a first AC voltage signal can be applied to the secondary side of a voltage transformer 10 that is associated with a first phase 4 while a second AC voltage signal is applied to the secondary side of a further voltage transformer 18, 19 that is associated with a further phase 5, 6 that is different than the first phase 4. At the same time, a first AC current signal can be supplied to the primary side of a current transformer 10 that is associated with the first phase 4 while a second AC current signal is supplied to the primary side of a further current transformer 18, 19 that is associated with the further phase 5, 6 that is different than the first phase 4. The first AC voltage signal is an implementation of the first test signal, and the first AC current signal is an implementation of the second test signal.

The second AC voltage signal can have a different amplitude than the first AC voltage signal. Alternatively or additionally, the second AC current signal can have a different amplitude than the first AC current signal. The testing apparatus 40 may be set up such that a product of the amplitude of the first AC voltage signal and the amplitude of the first AC current signal is different than a product of the amplitude of the second AC voltage signal and the amplitude of the second AC current signal.

The testing apparatus 40 may be set up such that the first AC voltage signal and the second AC voltage signal have a first phase shift relative to one another. The testing apparatus 40 may be set up such that the first AC current signal and the second AC current signal have a second phase shift relative to one another. The testing apparatus 40 may be set up such that the second phase shift is the same as the first phase shift. The testing apparatus 40 may be set up such that the first and second phase shifts are both equal to +120° or both equal to −120°.

The testing apparatus 40 may be set up to simulate a response of the protective device 30 or of the other device of the secondary system to the first test signal and the second test signal. To this end, by way of example, the testing apparatus 40 can ascertain what power should be recorded by the protective device 30. The testing apparatus 40 may be set up to ascertain at least one arithmetic sign of a power recorded by the protective device 30 depending on the phase angle between the first test signal, which is applied to the secondary side of the voltage transformer 10, and the second test signal, which is supplied to the primary side of the current transformer 20 associated with the same phase 4. The testing apparatus 40 may be set up to ascertain, depending on the phase angle between the first test signal, which is applied to the secondary side of the voltage transformer 10, and the second test signal, which is supplied to the primary side of the current transformer 20 associated with the same phase 4, whether the protective relay should switch off the circuit breaker 37 more rapidly or less rapidly, i.e. whether the protective relay associates the first test signal and the second test signal with a fault on the first side 8 or on the opposite second side 7 relative to the protective relay 30.

The testing apparatus 40 may be set up to take into consideration the amplitudes of the first and second test signals and optionally also parameters of at least the voltage transformer 10 for the computational ascertainment of the expected response of the protective device 30. By way of example, it is possible to ascertain what absolute value the power recorded by the protective device 30 should have from the product of the amplitudes of the first and second test signals and the transformation ratio of the voltage transformer 10. The transformation ratio of the voltage transformer 10 may be inputtable in user-defined fashion via an interface of the testing apparatus 40 and/or may be stored in nonvolatile fashion in a memory of the testing apparatus 40 for each of multiple voltage transformers.

A comparison of the expected response, computationally ascertained by the testing apparatus 40, and the actual response of the protective device 30 can be effected automatically by the testing apparatus 40. To this end, the testing apparatus 40 can have an interface for connection to the protective device 30, via which the response of the protective device 30 to the first test signal and the second test signal can be read. The comparison of the expected response, computationally ascertained by the testing apparatus 40, and the actual response of the protective device 30 can also be effected by a user.

Each voltage transformer to whose secondary side the first test signal is applied can be disconnected on the respective secondary side during the test. This allows the total power required for the test to be kept down.

The manner of operation and further features of the testing apparatus 40 according to exemplary embodiments are described further with reference to FIG. 2 to FIG. 9.

Figure 2:
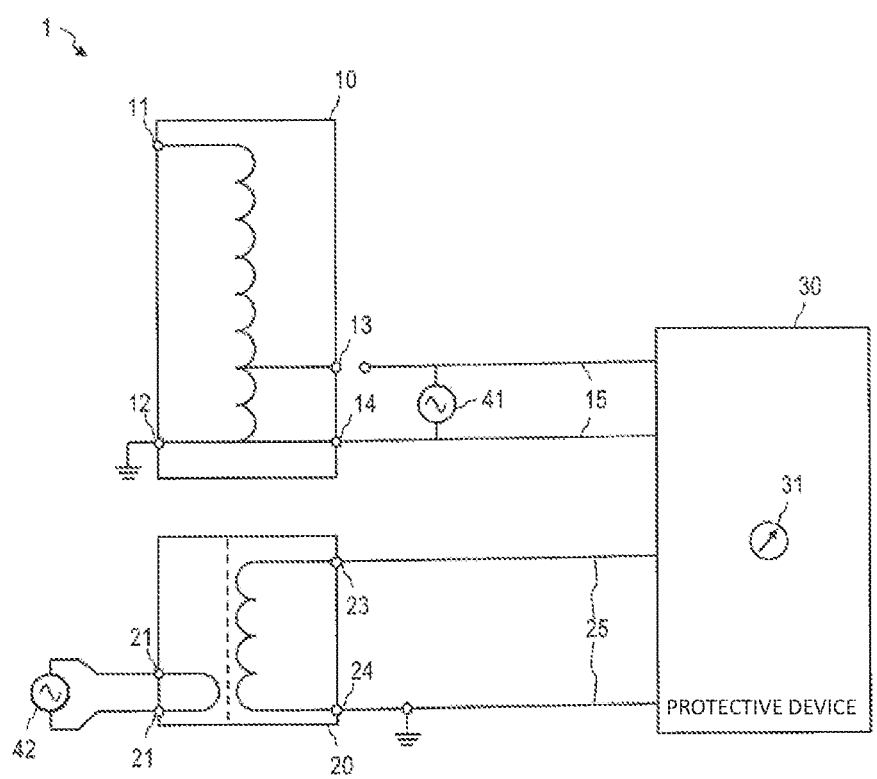
FIG. 2 shows a system with an apparatus according to an exemplary embodiment.

FIG. 2 is a depiction of a system 1 according to an exemplary embodiment. A voltage transformer 10 and a current transformer 20 have their input sides coupled to the same phase, for example a prescribed phase 4 of a three-phase line.

Output connections 13, 14 on the secondary side of the voltage transformer 10 are connected to inputs of a secondary device 30 via lines 15. An input connection 11 of the voltage transformer 10 may be connected to the phase 4. The voltage transformer 10 furthermore has an input-side ground connection 12.

Output connections 23, 24 on the secondary side of the current transformer 20 are connected to further inputs of the secondary device 30 via further lines 25. Input connections 21, 22 of the voltage transformer 20 may be connected to the same phase 4 to which the input connection 11 of the voltage transformer 10 is also connected.

The secondary device 30 is a device of the secondary system of an electrical energy system. The secondary device can comprise a control system display, a protective relay or a measuring device (meter), for example. A display 31 of the secondary device 30 can display a power recorded by the secondary device 30.

The testing apparatus has a voltage source 41 that is connectable to the secondary wiring 15 of the voltage transformer 10 in order to supply a first test signal to the secondary side of the voltage transformer 10. The voltage transformer 10 may be disconnected on the secondary side 13 during the test, so that the first test signal 41 is not applied between the output connections 13, 14 of the voltage transformer 10, but rather only the wiring as far as the secondary device 30 is checked.

The testing apparatus 40 has a current source 42 that is connectable to the primary side of the current transformer 20. The current source 42 may be set up for a connection to the input connections 21, 22 of the current transformer 20. The voltage transformer 10 may be disconnected on the secondary side 13 during the test, so that the first test signal 41 is not applied between the output connections 13, 14 of the voltage transformer 10, but rather only the wiring as far as the secondary device 30 is checked.

The voltage source 41 and the current source 42 may be included in separate testers that can move independently of one another. In this case, communication is advantageously effected between the two devices that is used to make certain that the second test signal generated by the current source 42 is in a desired phase relationship with the first test signal generated by the voltage source 41. By way of example, the communication between the testers can make certain that the first test signal and the second test signal are in phase. An electronic control device in one of the testers can make certain of the matching of the phase angle between the second test signal generated by the current source 42 and the first test signal generated by the voltage source 41. To this end, the electronic control device, which may be configured as a processor or controller, can send control signals to the other tester, which are evaluated by this other tester in order to produce a predefined phase angle between the first test signal and the second test signal. The different testers can have an interface that allows the exchange of synchronization information for synchronization. To provide the voltage source 41 and the current source 42, two transformers can be connected to the same system line in order to obtain a voltage source 41 and a current source 42 with a fixed phase relationship.

Depending on a response of the secondary device 30, for example depending on an arithmetic sign of a power display on the display device 31, it is possible to check that the current transformer 20 is installed with the correct polarity, the wiring lines 15 between the voltage transformer 10 and the inputs of the secondary device 30 are routed correctly, particularly without unintentional transposition, and the further wiring lines 25 between the current transformer 20 and the inputs of the secondary device 30 are routed correctly, particularly without unintentional transposition.

The testing apparatus may be set up to carry out the correct wiring of current and voltage transformers at sequential times or at the same time for current and voltage transformers that are associated with different phases. To this end, the testing apparatus may be configured to generate more than two test signals at the same time, and/or can apply a first test signal and a second test signal to the transformers of different phases at sequential times, as has been described with reference to FIG. 1.

The testing apparatus can comprise an electronic computation device that may be configured as a processor, controller, microprocessor or other integrated semiconductor circuit. The electronic computation device may be set up to computationally ascertain a response of the secondary device to the first test signal and the second test signal. To this end, the behavior of the secondary device 30 can be simulated. If a power is computed by the secondary device 30, for example, it is possible to predict from the phase difference between the second test signal and the first test signal what arithmetic sign the recorded power needs to have when the secondary wiring is correct. From the amplitudes of the first and second test signals, the phase difference between the second test signal and the first test signal and the transformation ratio of the current transformer 20, it is possible to predict the absolute value of the power.

The electronic computation device can alternatively or additionally carry out other calculations. By way of example, depending on the first test signal, the second test signal and information about the type of a protective relay, which is inputtable in user-defined fashion, it is possible to ascertain whether the protective relay should operate a circuit breaker as a reaction to the first test signal and the second test signal when the secondary wiring is correct. Optionally, depending on the first test signal, the second test signal and information about the type of a protective relay, which is inputtable in user-defined fashion, it is possible to ascertain how rapidly the protective relay should trip. The tripping time of the protective relay as a reaction to the first test signal and the second test signal can be compared with the computationally ascertained response.

Further configurations and features of the testing apparatus and of the system of FIG. 2 can correspond to the features described with reference to FIG. 1.

Figure 3:
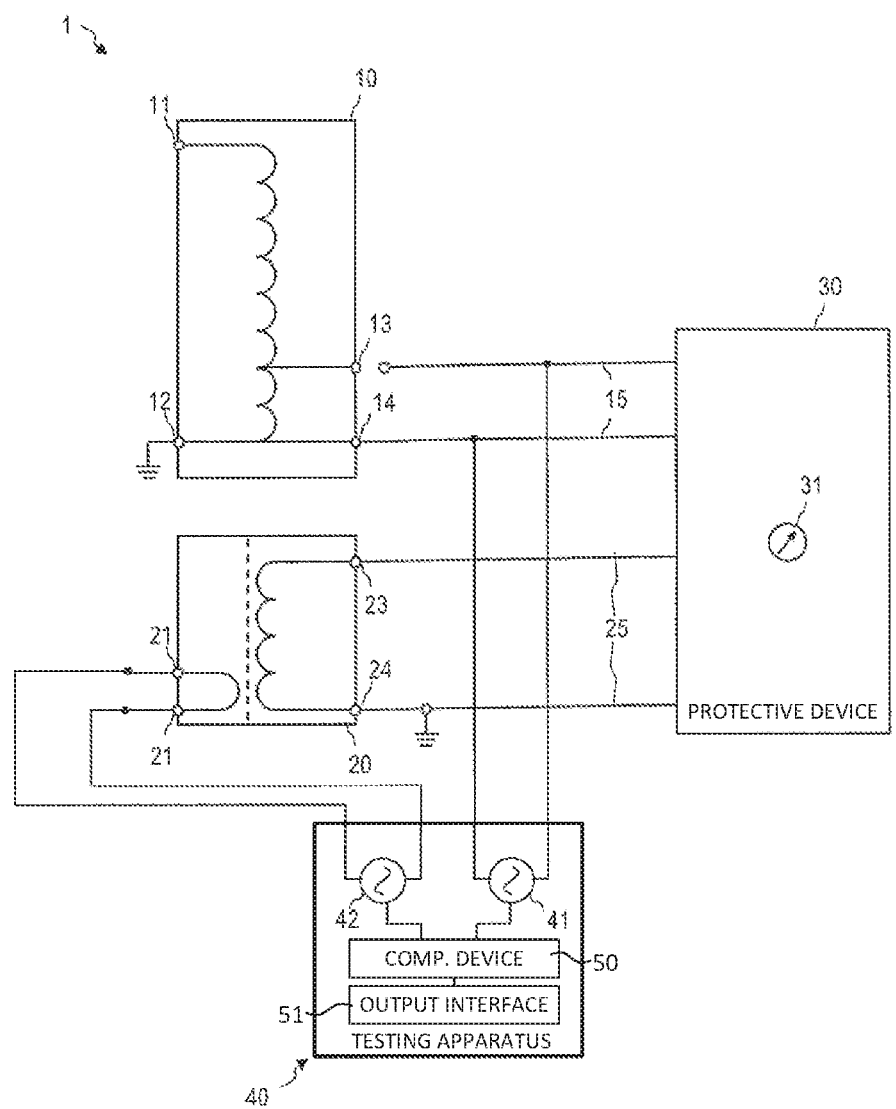
FIG. 3 shows a system with an apparatus according to an exemplary embodiment.

FIG. 3 is a depiction of a system 1 according to an exemplary embodiment that comprises a testing apparatus 40, configured as a tester, that is conductively connected to the primary side of a current transformer 20 and the secondary wiring of a voltage transformer 10. Features that can have configurations and effects described with reference to FIG. 1 and FIG. 2 are denoted by the same reference symbols as in FIG. 1 and FIG. 2.

The testing apparatus 40 comprises the first signal source 41, which may be an AC voltage source, and the second signal source 42, which may be an AC current source. The first signal source 41 and the second signal source 42 may be accommodated in the same housing of the testing apparatus 40. The testing apparatus 40 may be mobile, in particular portable.

The testing apparatus 40 is set up to test the correct wiring of the current transformer 20 and of the voltage transformer 10 and the correct direction of installation of the current transformer 20 by controlling the first signal source 41 and the second signal source such that a first test signal is applied to the secondary wiring 15 of the voltage transformer 10 and a second test signal is supplied to the primary side of the current transformer 20 at the same time. The testing apparatus 40 can have an electronic computation device 50 that is set up to control the first signal source 41 and the second signal source 42. The electronic computation device 50 may be set up to control the first signal source 41 and the second signal source 42 such that they output in-phase AC signals. The electronic computation device can comprise a processor, a controller, a microprocessor or a combination of said units or other integrated semiconductor circuits.

The testing apparatus 40 can also comprise only one signal source that is set up to generate both the first test signal and the second test signal. The testing apparatus 40 can comprise two or more signal sources and may be set up to supply test signals to the primary sides of at least two current transformers and to apply test signals to the secondary wiring of at least two voltage transformers at the same time.

The electronic computation device 50 may be set up to simulate the expected response of the secondary device 30 to the first test signal and the second test signal. To this end, by way of example, an arithmetic sign of a power ascertained by the secondary device 30, a tripping behavior of a protective relay or another characteristic variable that describes the behavior of the secondary device 30 as a response to the first test signal and the second test signal can be ascertained by the electronic computation device 50. To this end, the electronic computation device 50 can ascertain the power that should be recorded by the secondary device when the secondary wiring of the transformers 10, 20 is correct, for example, as has already been described in more detail.

The electronic computation device 50 can have an output interface 51. The output interface 51 can be used to output information about the computationally ascertained response. By way of example, the testing apparatus 40 may be set up to use the output interface 51 to output what arithmetic sign and optionally also what absolute value a power displayed on a power display 31 of the secondary device 30 should have that is ascertained as a reaction to the first test signal and the second test signal.

A comparison of the actual response of the secondary device 30 with the response predicted by the electronic computation device for correct secondary wiring of the transformers can be effected by a user. By way of example, a user can check whether the arithmetic sign of the power display in a control room matches the computationally predicted arithmetic sign of the power display of the control room.

Figure 4:
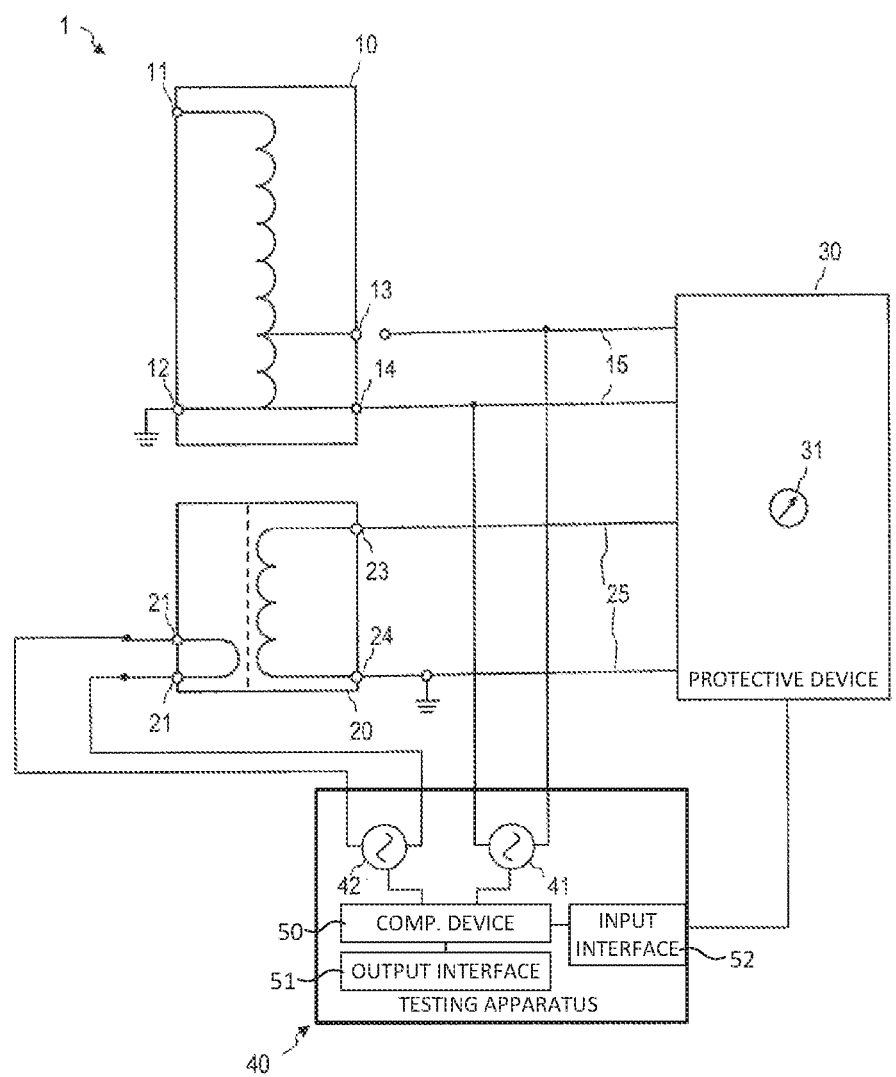
FIG. 4 shows a system with an apparatus according to an exemplary embodiment.

FIG. 4 is a depiction of a system 1 according to an exemplary embodiment that comprises a testing apparatus 40, configured as a tester, that is conductively connected to the primary side of a current transformer 20 and the secondary wiring of a voltage transformer 10. Features that can have configurations and effects described with reference to the preceding figures are denoted by the same reference symbols as in the preceding figures.

The testing apparatus 40 has an input interface 52. The input interface 52 is set up for a wired or wireless connection to the secondary device 30. The input interface 52 is set up to retrieve from the secondary device 30 information about the response of the secondary device 30 to the first test signal and the second test signal.

The electronic computation device 50 is coupled to the input interface 52 and is set up to automatically check, depending on the information retrieved via the input interface 52 about the response of the secondary device 30 and depending on information about the first test signal and the second test signal, whether the secondary wiring 15 of the voltage transformer 10 and the secondary wiring 25 of the current transformer 20 is embodied correctly.

Figure 5:
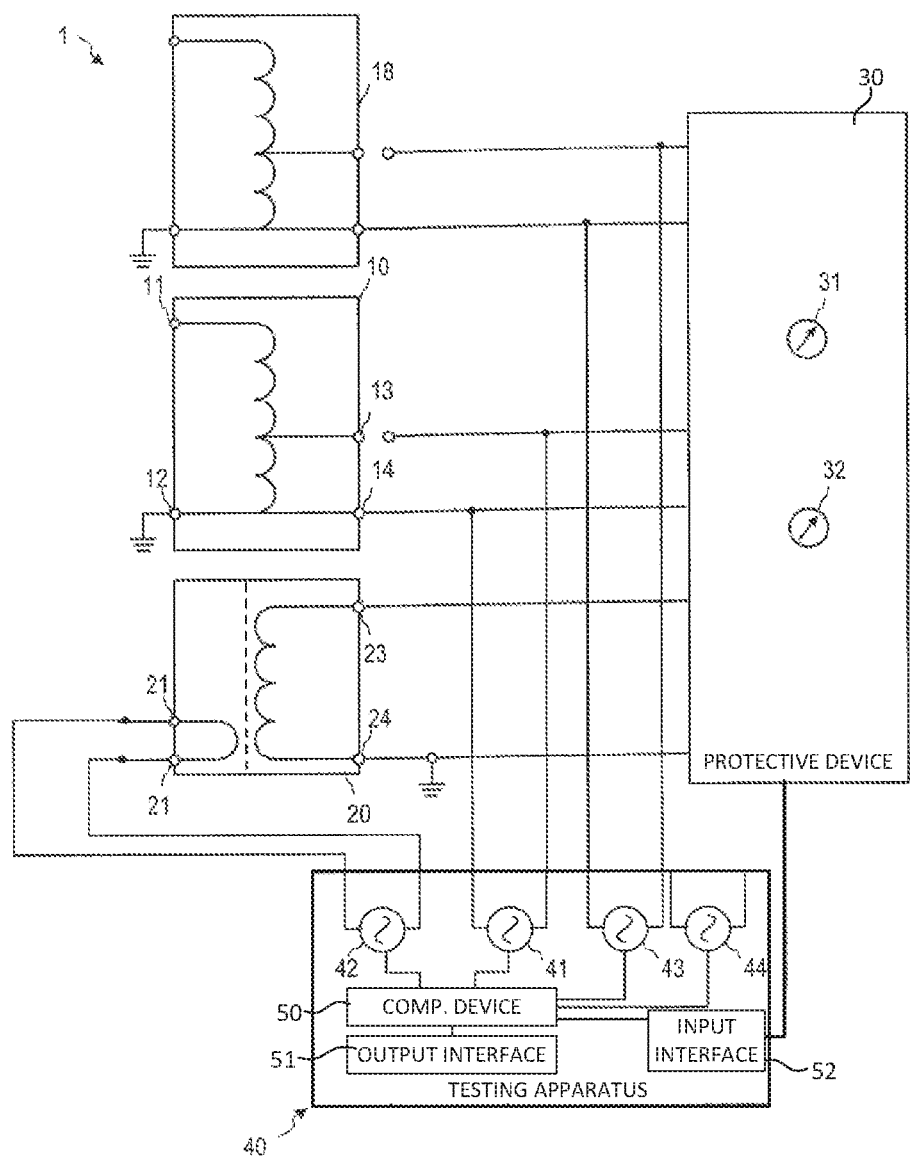
FIG. 5 shows a system with an apparatus according to an exemplary embodiment.

FIG. 5 is a depiction of a system 1 according to an exemplary embodiment that comprises a testing apparatus 40, configured as a tester, that is conductively connected to the primary side of a current transformer 20 and to the secondary wiring of a voltage transformer 10. Features that can have configurations and effects described with reference to the preceding figures are denoted by the same reference symbols as in the preceding figures.

The testing apparatus 40 is set up to apply test signals to at least two voltage transformers that are associated with different phases and the current transformers connected to the respective phases at the same time.

The testing apparatus 40 comprises at least one signal source 41, 42 that is set up to provide the first test signal on the secondary wiring of the voltage transformer 10 and the second test signal on the primary side of the current transformer 20 at the same time. In this case, the current transformer 20 has its input side connected to the same phase, for example the phase 4 in FIG. 1, as the voltage transformer 10.

The testing apparatus 40 is set up to apply or supply a further AC voltage signal to the secondary wiring of a further voltage transformer 18 and a further AC voltage signal to the primary side of the current transformer connected to the same phase as the voltage transformer 18 at the same time. In this way, test signals can be applied to at least two current transformers and to at least two voltage transformers at the same time. The correct wiring and the correct installation of two voltage transformers and two current transformers can be checked at the same time in one step of the test.

The testing apparatus 40 can comprise outputs that are set up to apply AC voltage signals to the secondary wiring of at least two voltage transformers at the same time and to supply AC current signal to the primary sides of at least two current transformers at the same time. The testing apparatus 40 can have outputs for connection to the secondary wiring of two, three or more than three voltage transformers and further outputs for connection to the primary side of two, three or more than three current transformers.

The testing apparatus 40 can comprise at least one further AC voltage source 43. The AC voltage source 41 and the at least one further AC voltage source 43 may be set up to apply AC voltage signals as test signals to the secondary wiring of two different voltage transformers 10, 18 whose primary sides are connected to different phases of the primary system at the same time.

The testing apparatus 40 can comprise at least one further AC current source 44. The AC current source 42 and the at least one further AC current source 44 may be set up to apply AC current signals as test signals to the primary side of two different current transformers 20, 28 whose primary sides are connected to different phases of the primary system at the same time.

The electronic computation device 50 of the testing apparatus 40 may be set up to control the signal sources for testing the wiring of transformers that are connected to different phases of the primary system such that they generate test signals at the same time or sequentially. In this case, test signals are advantageously applied to one, two or three pairs of current and voltage transformers that are connected to different phases of the primary system at the same time.

If test signals for transformers that are connected to at least two different phases are generated at the same time, the electronic computation device 50 can control the signal sources 41-44 such that test signals having different amplitudes are output to different current transformers and/or to different voltage transformers. By way of example, the electronic computation device 50 may be set up to control the signal source 41-44 such that the AC voltage signal applied to the secondary wiring of the further voltage transformer 18 has an amplitude that is smaller than the amplitude of the first test signal applied to the secondary wiring of the voltage transformer 10.

Alternatively or additionally, the electronic computation device 50 may be set up to control the signal sources 41-44 such that the AC current signal supplied to the primary side of the further current transformer 28 has an amplitude that is smaller than the amplitude of the second test signal supplied to the primary side of the current transformer 20.

The electronic computation device 50 may be set up to control the signal sources 41-44 such that when test signals for transformers that are connected to different phases are generated at the same time, the product of the amplitude of the AC voltage signal applied to the secondary wiring of the voltage transformer and the amplitude of the AC current signal impressed into the primary side of the current transformer associated with the same phase is dependent on that phase of the primary system to which the input sides of the current transformer and the voltage transformer are connected.

As an alternative or in addition to alteration of the amplitude from phase to phase, the electronic computation device 50 may also be set up to control the signal source 41-44 such that a phase difference between the AC voltage signal applied to the secondary wiring of the voltage transformer and the AC current signal impressed into the primary side of the transformer associated with the same phase is dependent on that phase of the primary system to which the input sides of the current transformer and the voltage transformer are connected.

The electronic computation device 50 may be set up to control the signal sources 41-44 such that the AC voltage signal applied to the secondary wiring of the voltage transformer and the AC current signal impressed into the primary side of the current transformer associated with the same phase have the same frequency for each of the phases. The electronic computation device 50 may be set up to control the signal sources 41-44 such that the AC voltage signal applied to the secondary wiring of the voltage transformer and the AC current signal impressed into the primary side of the current transformer associated with the same phase are in phase with each of the phases.

The electronic computation device 50 may be set up to control the signal sources 41-44 such that the AC voltage signals that are applied to the secondary wiring of voltage transformers 10, 18 that are associated with different phases are phase shifted relative to one another. By way of example, the AC voltage signal that is applied to the secondary wiring of the further voltage transformer 18 by the AC voltage source 43 may be phase shifted through +120° or through −120° in comparison with the AC voltage signal that is applied to the secondary wiring of the voltage transformer 10 by the AC voltage source 41.

Additionally, the electronic computation device 50 may be set up to control the signal sources 41-44 such that the AC current signals that are supplied to the primary sides of current transformers 20, 28 that are associated with different phases are phase shifted relative to one another. By way of example, the AC current signal that is supplied to the primary side of the further current transformer 28 by the AC current source 44 may be phase shifted through +120° or through −120° in comparison with the AC current signal that is supplied to the primary side of the current transformer 20 by the AC current source 42.

If test signals for transformers that are connected to all three phases 4, 5, 6 are generated at the same time, the AC voltage signals applied to the secondary wiring of different voltage transformers may each be phase shifted through +120° or through −120° relative to one another. The AC current signals supplied to the primary sides of the corresponding current transformers may accordingly each be phase shifted through +120° or through −120° relative to one another. The test signals that are provided to voltage and current transformers connected to the same phase may each be in phase.

The configurations described here for a testing apparatus and a testing method in which test signals are provided to transformers connected to different phases at the same time facilitate the association of the responses of the secondary device 30 that are expected for the different phases and the respective actual responses of the secondary device 30. By way of example, it is possible for more than one power display 31, 32 to be read. The expected and actual response can be compared by a user or automatically by the testing apparatus 40 in order to identify wiring errors and installation of current transformers with polarity errors.

Figure 6:
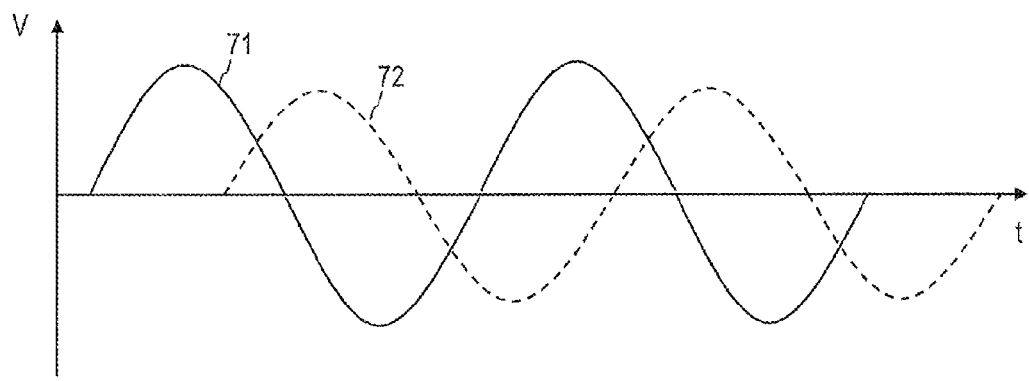
FIG. 6 shows AC voltage signals that can be generated by apparatuses and methods according to exemplary embodiments for testing multiple phases at the same time.

FIG. 6 shows an example of test signals 71, 72 that can be applied to the secondary wiring of voltage transformers whose primary sides are connected to different phases 4, 5, 6 by the testing apparatus 40 at the same time.

The test signals 71, 72 may each be AC voltage signals that can have the same frequency. The test signal 71 that is applied to the secondary wiring of the voltage transformer 10 connected to a first phase 4 has a first amplitude. The further test signal 72, which is applied to the secondary wiring of the voltage transformer 18, 19 connected to a phase 5, 6, which is different than the first phase, has a second amplitude. The second amplitude is different than the first amplitude.

As an alternative or in addition to the use of different amplitudes of AC voltage signals that are applied to the secondary wiring of different voltage transformers, it is also possible for the amplitudes of the AC current signals that are supplied to the primary sides of different current transformers to be chosen differently.

As is likewise depicted in FIG. 6, the further test signal 72 that is applied to the secondary wiring of the voltage transformer 18, 19 connected to a phase 5, 6, which is different than the first phase, can have a phase shift of +120° or of −120° relative to the test signal 71 that is applied to the secondary wiring of the voltage transformer 10 connected to a first phase 4.

The AC current signals that are supplied to the primary sides of the current transformers connected to different phases can likewise have a phase shift of +120° or of −120° relative to one another.

Figure 7:
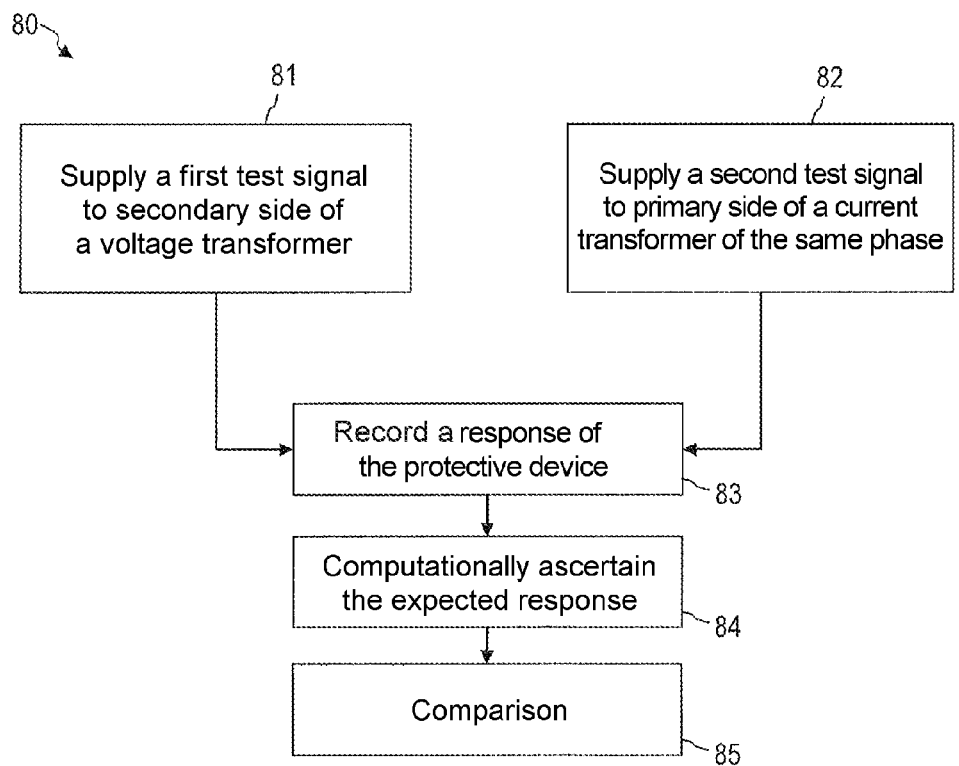
FIG. 7 shows a flowchart for a method according to an exemplary embodiment.

FIG. 7 is a flowchart 80 for a method according to an exemplary embodiment. The method can be carried out using the testing apparatus 40 according to an exemplary embodiment, particularly using a testing apparatus 40 with one of the configurations described with reference to the preceding figures.

The method can be used to test the wiring of at least one current transformer and at least one voltage transformer whose primary sides are connected to a phase of a primary system. The secondary sides of the current transformer and the voltage transformer may be connected to inputs of a protective device, a measuring device, a control room or another secondary device.

At 81, a first test signal is applied to the secondary side of a voltage transformer. The first test signal can be applied to the secondary wiring that connects the voltage transformer to inputs of the secondary device 30. The first test signal may be an AC voltage signal. The secondary wiring may be disconnected on the secondary side of the voltage transformer for the test.

At 82, a second test signal is generated at the same time as the first test signal. The second test signal is impressed into the primary side of the current transformer, the input side of which is connected to the same phase of the primary system as the voltage transformer. The second test signal may be an AC current signal. The second test signal may be in phase with the first test signal.

At 83, a response of the secondary device, which can comprise a protective relay, for example, is recorded. The recording of the response can comprise reading an arithmetic sign and optionally also an absolute value of a power ascertained by the secondary device, which the secondary device ascertains as a response to the first test signal and the second test signal. The recording of the response can comprise recording a period of time in which a protective relay switches off a circuit breaker. The recording of the response can comprise reading a power display in a control room.

At 84, an expected response of the protective device can be simulated. To this end, an arithmetic sign of a power can be computationally ascertained that should be recorded by the secondary device if the current transformer is installed without polarity errors and both the current transformer and the voltage transformer are wired up to the protective device correctly. Optionally, an absolute value of a power can be computationally ascertained that should be recorded by the secondary device if the current transformer is installed without polarity errors and both the current transformer and the voltage transformer are wired up to the protective device correctly. If test signals are supplied to the transformers of multiple phases at the same time, it is also possible for relative magnitudes of the power absolute values to be computationally ascertained that are expected if the current transformers are installed without polarity errors and both the current transformers and the voltage transformers are wired up to the protective device correctly.

At 85, the expected response can be compared with the actually recorded response. If there is a match, correct installation of the current transformer without polarity errors and correct wiring of the transformers to the inputs of the protective device can be inferred. If there is a discrepancy, it is possible to ascertain that there is a wiring error or that the current transformer has been installed with the wrong polarity. By way of example, such an error can be inferred if the arithmetic sign of the power ascertained by the protective device is the opposite of an arithmetic sign of the power that is expected for the first and second test signals.

In addition to the test on the wiring, the method can also be used to ascertain whether settings within the secondary device 30 are correct and/or the transformers are connected to the inputs of the secondary device 30 that are associated with the appropriate phase. By way of example, it is possible to check whether the supplying of test signals to the transformers that are connected to a first phase 4 of the primary system also results in a corresponding power display in a control room, or whether the power is displayed incorrectly for another phase 5, 6 of the primary system.

The wiring and the correct installation of transformers whose primary side is coupled to different phases of the primary system can be checked sequentially or at the same time.

Figure 8:
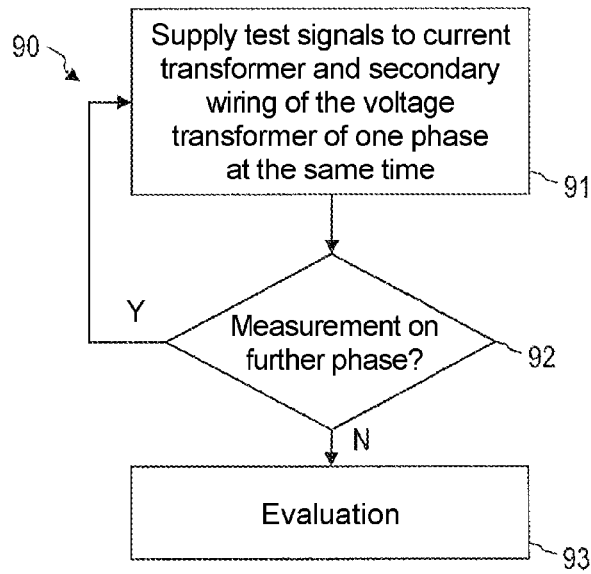
FIG. 8 shows a flowchart for a method according to an exemplary embodiment.

FIG. 8 is a flowchart 90 for a method according to an exemplary embodiment. The method can be carried out using the testing apparatus 40 according to an exemplary embodiment, particularly using a testing apparatus 40 with one of the configurations described with reference to the preceding figures.

The method can be used to test the wiring of current and voltage transformers sequentially for multiple phases.

At 91, a first test signal is applied to the secondary wiring of a voltage transformer whose input side is connected to a phase for the primary system and a second test signal is supplied to the primary side of the current transformer that is connected to the same phase at the same time. This can be effected as described with reference to steps 81 and 82 of the method from FIG. 7.

The response of the secondary device to the first test signal and the second test signal can be recorded. This can be effected as described with reference to step 83 of the method from FIG. 7.

At 92, a check can be performed to determine whether the measurements have already been carried out on the transformers of all the phases. If the measurement has not yet been carried out on the transformers of all the phases, the method returns to step 91. The test signals are now supplied to the secondary wiring of a voltage transformer and to the primary side of a current transformer that are connected to a different phase of the primary system.

If it is ascertained at step 92 that the measurements have been carried out on the transformers of all the phases, the method continues at step 93. At 93, it is possible to check whether the response of the secondary device that has been recorded in each case as a reaction to the first test signal and the second test signal for each pair of transformers matches the expected response. In this way, it is possible to ascertain whether there are wiring or polarity errors. Additionally, it is possible to ascertain which pair of current and voltage transformers has the applicable error.

Figure 9:
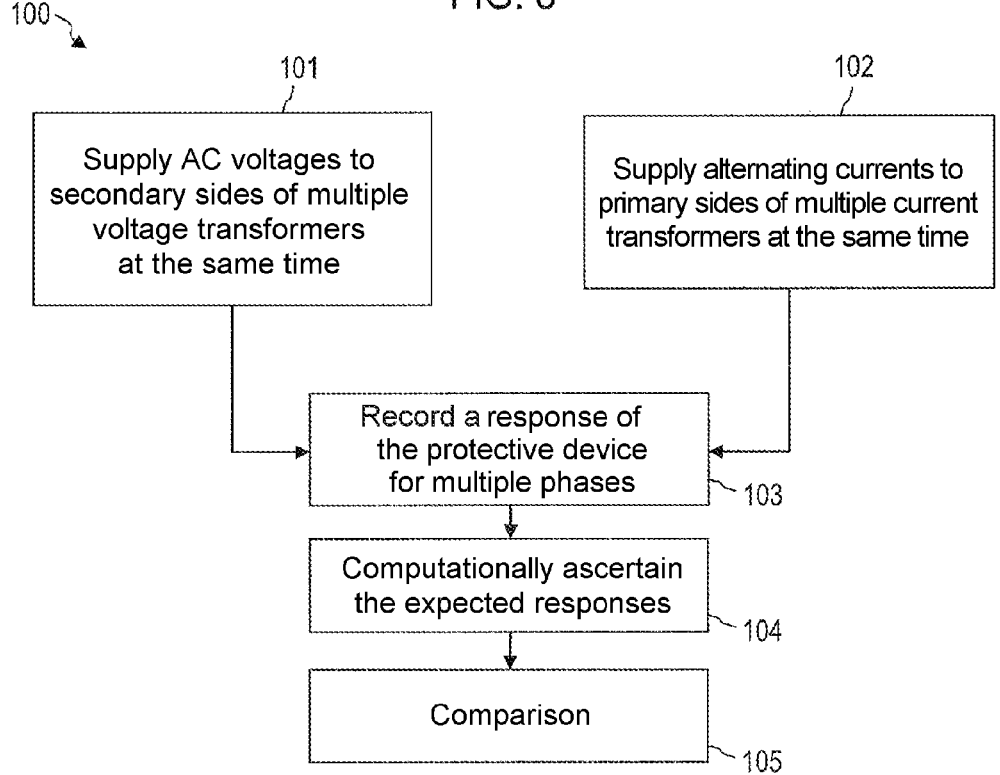
FIG. 9 shows a flowchart for a method according to an exemplary embodiment.

FIG. 9 is a flowchart 100 for a method according to an exemplary embodiment. The method can be carried out using the testing apparatus 40 according to an exemplary embodiment, particularly using a testing apparatus 40 with one of the configurations described with reference to the preceding figures.

The method can be used to test the wiring of current and voltage transformers for multiple phases at the same time in one measurement. The multiple current and voltage transformers are in this case connected between three phases of a three-phase line and the secondary device, for example a protective relay. For the test, the secondary sides and the voltage transformers can each be disconnected at just one terminal.

At 101, AC voltage signals are applied to the secondary sides of multiple voltage transformers at the same time. Each of the AC voltage signals can be applied to the secondary wiring that connects a respective voltage transformer to inputs of the secondary device 30. The secondary wiring can be disconnected on the secondary side of the voltage transformer at one terminal for the test.

The different AC voltages can have different amplitudes from one another. The different AC voltages may be phase shifted relative to one another. The different AC voltages can have a phase shift of +120° or of −120° relative to one another.

At 102, multiple AC current signals are supplied to the primary sides of multiple current transformers at the same time as the AC voltages are applied. In this case, an AC current can be supplied to the primary side of each current transformer if an AC voltage is applied to the secondary wiring of the voltage transformer connected to the same phase. The AC current signal that is impressed into a current transformer may be in phase with the AC voltage signal that is applied to the secondary wiring of the voltage transformer connected to the same phase.

The different AC currents can have different amplitudes from one another. The different AC currents may be phase shifted relative to one another. The different AC currents can have a phase shift of +120° or of −120° relative to one another.

At 103, a response of the secondary device, which can comprise a protective relay, for example, is recorded. The recording of the response can comprise reading an arithmetic sign and optionally also an absolute value of multiple powers ascertained by the secondary device, which the secondary device ascertains as a response to the AC voltage signals and the AC current signals for the different phases. The recording of the response can comprise recording a period of time in which a protective relay switches off a circuit breaker. The recording of the response can comprise reading a power display in a control room for multiple phases.

At 104, an expected response of the protective device can be simulated. The determination of the expected response can be effected as at step 84 of the method from FIG. 7, expected powers being able to be ascertained separately for multiple phases, for example.

At 105, the expected response can be compared with the actually recorded response. To this end, for each of the three phases, for example, an arithmetic sign of a power respectively ascertained by the protective device can be compared with that arithmetic sign that is expected as a reaction to the AC voltage and the AC current when the wiring of the transformers is correct. This comparison can be carried out for each of the three phases. If there is a match, correct installation of the current transformer without polarity errors and correct wiring of the transformers to the inputs of the protective device can be inferred. If there is a discrepancy, it is possible to ascertain that there is a wiring error or that the current transformer has been installed with the wrong polarity. By way of example, such an error can be inferred if the arithmetic sign of the power ascertained by the protective device is the opposite of an arithmetic sign of the power that is expected for the first and second test signals.

In addition to the test on the wiring, the method can also be used to ascertain whether settings within the secondary device 30 are correct and/or the transformers are connected to the inputs of the secondary device 30 that are associated with the appropriate phase. By way of example, the different amplitudes of the AC voltages and/or AC currents that are impressed as test signals can be used to check whether the supplying of test signals to the transformers that are connected to a first phase 4 of the primary system also results in the corresponding power display in a control room, or whether this power is displayed incorrectly for another phase 5, 6 of the primary system.

While methods, apparatuses and systems have been described in detail with reference to the figures, additional or alternative features can be used for exemplary embodiments. By way of example, the testing apparatus 40 may be set up such that an amplitude and/or frequency of at least the second test signal supplied to the primary side of the current transformer is altered on the basis of time in order to avoid magnetizing the current transformer.

While exemplary embodiments in which sinusoidal AC signals have been used as test signals have been described, it is also possible to use other AC signals, for example square-wave or triangular-wave form signals, or DC voltage and DC current signals, as test signals.

The methods, apparatuses and systems can be used to detect incorrect installation of current transformers and/or incorrect wiring between transformers and the inputs of the device of the secondary system. Additionally, the disclosed methods, apparatuses and systems can also be used to check settings within the device of the secondary system. By way of example, the tripping behavior of a protective relay can be used to check whether rapid isolation is effected in the event of a fault that occurs in a predefined direction, for example on an overhead line, relative to the protective relay.

Apparatuses, methods and systems according to exemplary embodiments can be used particularly for secondary devices that are coupled to the primary system of an energy network, of a transformer substation or of a power station both via one or more current transformers and via one or more voltage transformers in order to perform monitoring and/or protection functions.

Apparatuses, methods and systems according to exemplary embodiments reduce the risk of faults being able to occur in an electrical energy system on account of incorrect installation or incorrect wiring of current and voltage transformers that are connected to a protective relay or another device of the secondary system.

The invention claimed is:

1. A method for testing wiring of a current transformer and a voltage transformer of a device of an electrical energy system, comprising the steps applying a first test signal generated by a first test signal source to a secondary side of the voltage transformer, and impressing a second test signal generated by a second test signal source into a primary side of the current transformer, wherein the first test signal and the second test signal are generated at the same time, detecting a response of the device to the first test signal and the second test signal, calculating an expected response depending on an amplitude of the first test signal, an amplitude of the second test signal and a phase angle between the first test signal and the second test signal, and comparing the detected response with the expected response to detect an incorrect wiring of the current transformer and the voltage transformer.

2. The method as claimed in claim 1, wherein the response of the device comprises an arithmetic sign or an absolute value of a power recorded by the device.

3. The method as claimed in claim 1, wherein the first test signal is an AC voltage and wherein the second test signal is an AC current.

4. The method as claimed in claim 1, wherein the first test signal and the second test signal are in phase.

5. The method as claimed in claim 1, wherein the first test signal is applied to the secondary side of the voltage transformer that is associated with a first phase of multiple phases, and wherein the second test signal is impressed into the primary side of the current transformer that is connected to the first phase.

6. The method as claimed in claim 5, further comprising the step:

generating at least one further test signal to test the wiring of at least one further transformer that is connected to a further phase, which is different than the first phase, of a multi-phase line.

7. The method as claimed in claim 6, wherein the at least one further test signal is generated at the same time as the first test signal and the second test signal.

8. The method as claimed in claim 1, wherein the first test signal and at least one further AC voltage signal are applied to the secondary side of at least two voltage transformers of the device that are associated with different phases at the same time.

9. The method as claimed in claim 8, wherein the first test signal and the at least one further AC voltage signal have different amplitudes.

10. The method as claimed in claim 1, wherein the second test signal and at least one further AC current signal are applied to the primary side of at least two current transformers of the device that are associated with different phases at the same time.

11. The method as claimed in claim 10, wherein the second test signal and the at least one further AC current signal have different amplitudes.

12. The method as claimed in claim 1, wherein the voltage transformer is disconnected on the secondary side for the testing of the wiring of the current transformer and the voltage transformer.

13. The method as claimed in claim 1, wherein the device comprises a protective relay.

14. A testing apparatus for testing wiring of a current transformer and a voltage transformer of a device of an electrical energy system, comprising a first terminal for applying a first test signal generated by a first test signal source to a secondary side of the voltage transformer, a second terminal for impressing a second test signal generated by a second test signal source into a primary side of the current transformer, wherein the testing apparatus is set up to generate the first test signal applied to the secondary side of the voltage transformer and the second test signal impressed into the primary side of the current transformer at the same time, and an electronic computation device that is set up to computationally ascertain an expected response of the device to the first test signal and the second test signal from an amplitude of the first test signal, an amplitude of the second test signal and a phase relationship between the first test signal and the second test signal, wherein the testing apparatus is configured to detect a response of the device of the electrical energy system to the first test signal and the second test signal and to compare the detected response with the expected response to detect an incorrect wiring of the current transformer and the voltage transformer.

15. The testing apparatus as claimed in claim 14, further comprising an output interface for outputting the computationally ascertained expected response or an input interface for receiving the response of the device.

16. The testing apparatus as claimed in claim 14, further comprising a controllable voltage source as the first test signal source for generating the first test signal and a controllable current source as the second test signal source for generating the second test signal.

17. The testing apparatus as claimed in claim 14, wherein the testing apparatus is set up to apply the first test signal and at least one further AC voltage signal to the secondary side of at least two voltage transformers of the device that are associated with different phases at the same time.

18. The testing apparatus as claimed in claim 17, wherein the testing apparatus is set up to generate the first test signal and the at least one further AC voltage signal such that they have different amplitudes.

19. The testing apparatus as claimed in claim 14, wherein the testing apparatus is set up to impress the second test signal and at least one further AC current signal into the primary side of at least two current transformers of the device that are associated with different phases at the same time.

20. The testing apparatus as claimed in claim 19, wherein the testing apparatus is set up to generate the second test signal and the at least one further AC current signal such that they have different amplitudes.

21. The testing apparatus as claimed in claim 14, wherein the testing apparatus is configured as a portable tester.

22. A system comprising
the testing apparatus as claimed in claim 14, and
the device comprising the voltage transformer and the current transformer.

23. The system as claimed in claim 22,
wherein the device comprises a protective relay, a power display in a control room or a measuring device.

\* \* \* \* \*